United States Patent
Lin et al.

(10) Patent No.: US 10,116,335 B2
(45) Date of Patent: Oct. 30, 2018

(54) DATA PROCESSING METHOD, MEMORY STORAGE DEVICE AND MEMORY CONTROL CIRCUIT UNIT

(71) Applicant: PHISON ELECTRONICS CORP., Miaoli (TW)

(72) Inventors: Yu-Hsiang Lin, Yunlin County (TW); Cheng-Che Yang, New Taipei (TW); Shao-Wei Yen, Kaohsiung (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/188,995

(22) Filed: Jun. 22, 2016

(65) Prior Publication Data

US 2017/0302299 A1  Oct. 19, 2017

(30) Foreign Application Priority Data

Apr. 15, 2016  (TW) .............................. 105111796 A

(51) Int. Cl.
| | | |
|---|---|---|
| *H03M 13/00* | (2006.01) | |
| *H03M 13/29* | (2006.01) | |
| *G06F 11/10* | (2006.01) | |
| *H03M 13/11* | (2006.01) | |
| *G11C 29/52* | (2006.01) | |
| *G11C 29/00* | (2006.01) | |

(52) U.S. Cl.
CPC ..... *H03M 13/2906* (2013.01); *G06F 11/1012* (2013.01); *G06F 11/1068* (2013.01); *H03M 13/1102* (2013.01); *G11C 29/52* (2013.01); *G11C 29/702* (2013.01)

(58) Field of Classification Search
CPC ........... H03M 13/2906; H03M 13/1102; G06F 11/1012; G06F 11/1068
See application file for complete search history.

(56) References Cited

U.S. PATENT DOCUMENTS

| | | | | |
|---|---|---|---|---|
| 8,276,043 B2 * | 9/2012 | Yano | .................... | G06F 11/1072 714/766 |
| 8,448,041 B1 * | 5/2013 | Zeng | ................. | H03M 13/6505 714/758 |
| 8,750,042 B2 * | 6/2014 | Sharon | ................. | G11C 11/5642 365/185.03 |
| 8,751,901 B2 * | 6/2014 | Yano | .................... | G06F 11/1072 714/764 |
| 9,384,128 B2 * | 7/2016 | Tuers | ................... | G06F 12/0246 |
| 9,542,344 B2 * | 1/2017 | Tuers | ...................... | G06F 13/18 |

* cited by examiner

*Primary Examiner* — Esaw T Abraham
(74) *Attorney, Agent, or Firm* — JCIPRNET

(57) ABSTRACT

A data processing method, a memory storage device and a memory control circuit unit are provided. The method includes: receiving first write data; performing a first stage encoding operation of a low-density parity-check (LDPC) code on the first write data and generating first transition data; performing a second stage encoding operation of the LDPC code on the first transition data and generating a first error correcting code (ECC); receiving second write data; and performing the first stage encoding operation of the LDPC code on the second write data during a time period of performing the second stage encoding operation of the LDPC code on the first transition data. Accordingly, the data processing efficiency corresponding to the LDPC code can be improved.

14 Claims, 8 Drawing Sheets

DATA PROCESSING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105111796, filed on Apr. 15, 2016. The entirety of the above-mentioned patent application is hereby incorporated by reference herein and made a part of this specification.

BACKGROUND

Technical Field

The disclosure relates an encoding and decoding mechanism, and more particularly, to a data processing method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

Generally, in order to maintain reliability of data, the data is encoded to generate a corresponding error correcting code before the data is stored into the rewritable non-volatile memory module. Then, the error correcting code is stored along with the corresponding data into the rewritable non-volatile memory module. Later, when the data is read from the rewritable non-volatile memory module, the corresponding error correcting code may be used to correct possible errors in the read data.

In general, it is quite common to apply a low-density parity-check (LDPC) code in aforesaid encoding mechanism. However, in ordinary LDPC encoding circuits, the previous data is completely generated before the next data may be successively processed by the same encoding circuit. Therefore, in order to improve encoding efficiency, disposition of more encoding circuits in the memory device is often required but leads to waste of system resources. Moreover, if the encoding efficiency is not correspondingly improved as data transmission bandwidth getting increasingly larger, data access speed of the memory device may also be affected.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

Accordingly, the disclosure is directed to a data processing method, a memory storage device and a memory control circuit unit, which are capable of improving data processing efficiency corresponding to the low-density parity-check (LDPC) code.

An exemplary embodiment of the disclosure provides a data processing method for encoding data stored in a rewritable non-volatile memory module. The data processing method includes: receiving first write data; performing a first stage encoding operation of a LDPC code on the first write data and generating first transition data; performing a second stage encoding operation of the LDPC code on the first transition data and generating a first error correcting code (ECC), wherein the first ECC and the first write data is stored into the rewritable non-volatile memory module; receiving second write data; and performing the first stage encoding operation of the LDPC code on the second write data during a time period of performing the second stage encoding operation of the LDPC code on the first transition data.

Another exemplary embodiment of the disclosure provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The memory control circuit unit is configured to receive first write data from the host system. The memory control circuit unit is further configured to perform a first stage encoding operation of a LDPC code on the first write data and generate first transition data. The memory control circuit unit is further configured to perform a second stage encoding operation of the LDPC code on the first transition data and generate a first ECC. The memory control circuit unit is further configured to send a first write command sequence which instructs to store the first ECC and the first write data into the rewritable non-volatile memory module. The memory control circuit unit is further configured to receive second write data from the host system. The memory control circuit unit is further configured to perfoiiii the first stage encoding operation of the LDPC code on the second write data during a time period of perfoiiiiing the second stage encoding operation of the LDPC code on the first transition data.

Another exemplary embodiment of the disclosure provides a memory control circuit unit, which is configured to control a rewritable non-volatile memory module. The memory control circuit unit includes a host interface, a memory interface, a first stage encoding circuit, a second stage encoding circuit and a memory control circuit unit. The host interface is configured to couple to a host system. The memory interface is configured to couple to a rewritable non-volatile memory module. The memory management circuit is coupled to the host interface, the memory interface, the first stage encoding circuit and the second stage encoding circuit. The memory management circuit is configured to receive first write data from the host system. The first stage encoding circuit is configured to perform a first stage encoding operation of a LDPC code on the first write data and generate first transition data. The second stage encoding circuit is configured to perform a second stage encoding operation of the LDPC code on the first transition data and generate a first ECC. The memory management circuit is further configured to send a first write command sequence which instructs to store the first ECC and the first write data into the rewritable non-volatile memory module. The memory management circuit is further configured to receive second write data from the host system. The first stage encoding circuit is further configured to perform the first stage encoding operation of the LDPC code on the second write data during a time period of performing the second stage encoding operation of the LDPC code on the first transition data by the second stage encoding circuit.

Based on the above, in correspondence to the received first write data, the first stage encoding operation of the LDPC code is performed to generate the first transition data.

Then, in correspondence to the first transition data, the second stage encoding operation of the LDPC code is performed to generate the first ECC for protecting the first write data. Further, in correspondence to the received second write data, the first stage encoding operation of the LDPC code may also be simultaneously performed during the time period of performing the second stage encoding operation on the first transition data. As a result, the idle time of at least part of the encoding circuit can be reduced and the data processing efficiency corresponding to the LDPC code of the encoding circuit may be improved.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
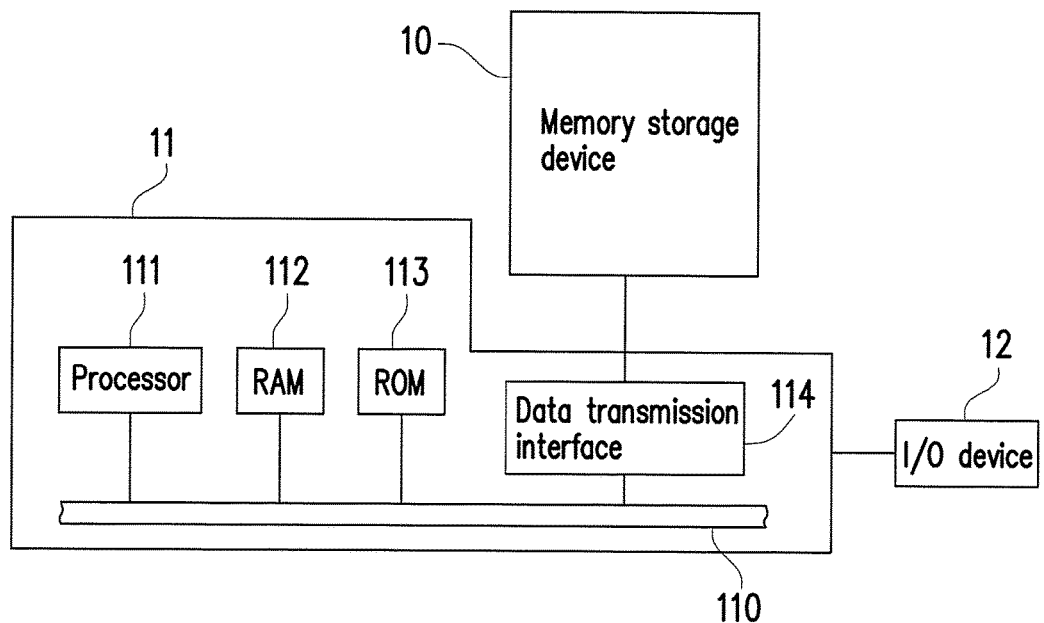
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A,B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured together with a host system so that the host system may write data into the memory storage device or read data from the memory storage device.

Figure 2:
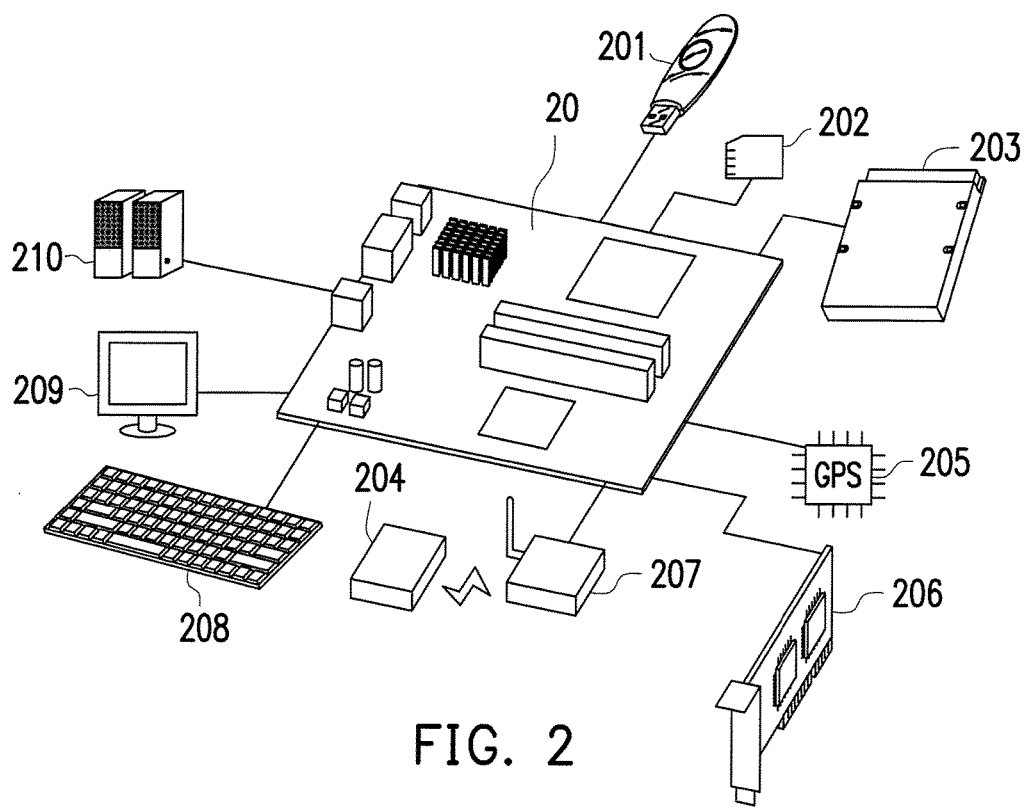
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 111 is coupled to an I/O device 12 through the system bus 110. For example, the host system 11 can transmit output signals to the I/O device 12 or receive input signals from I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices, such as a GPS (Global Positioning System) module 205, a network interface card 206, a wireless transmission device 207, a keyboard 208, a monitor 209 and/or a speaker 210 through the system bus 110. For example, in an exemplary embodiment, the main board 20 may access the wireless memory storage device 204 through the wireless transmission device 207.

Figure 3:
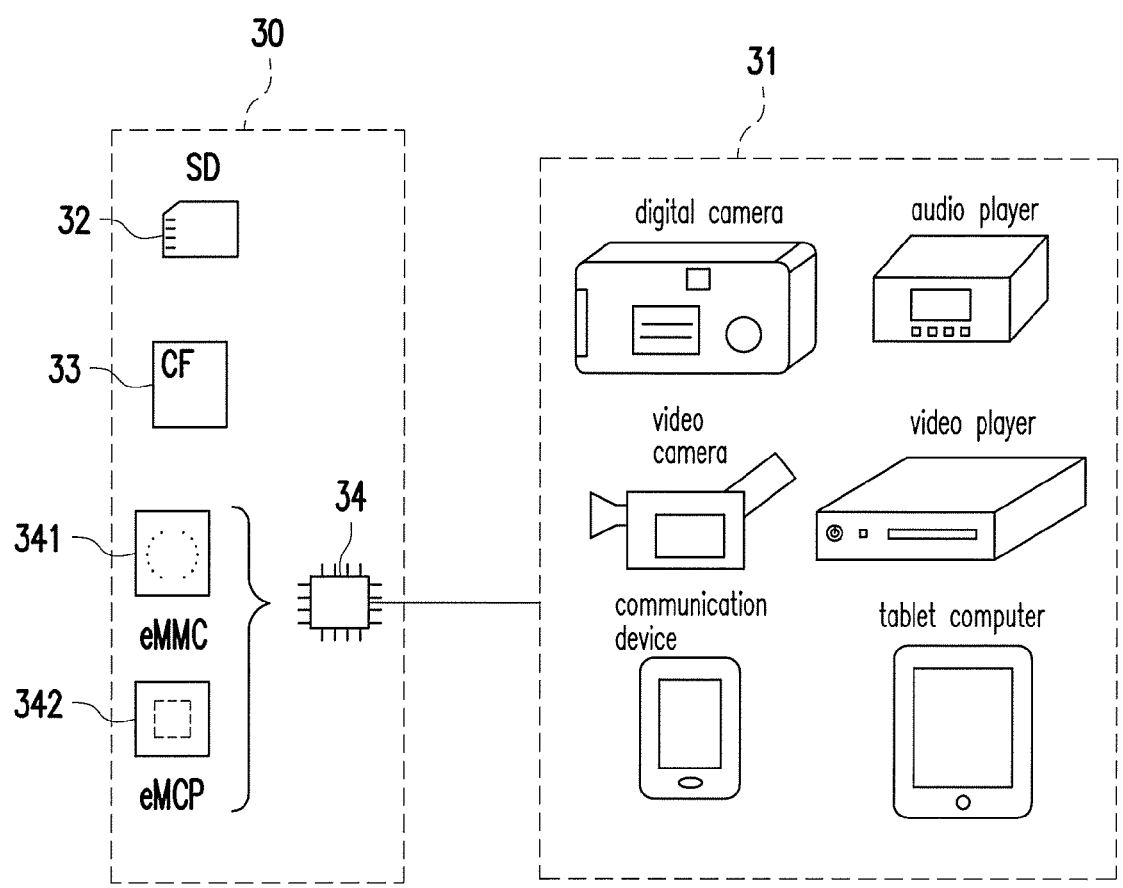
FIG. 3 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system, such as a digital camera, a video camera, a communication device, an audio player, a video player or a tablet computer, whereas a memory storage device 30 may be various non-volatile memory devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) storage device 342.

Figure 4:
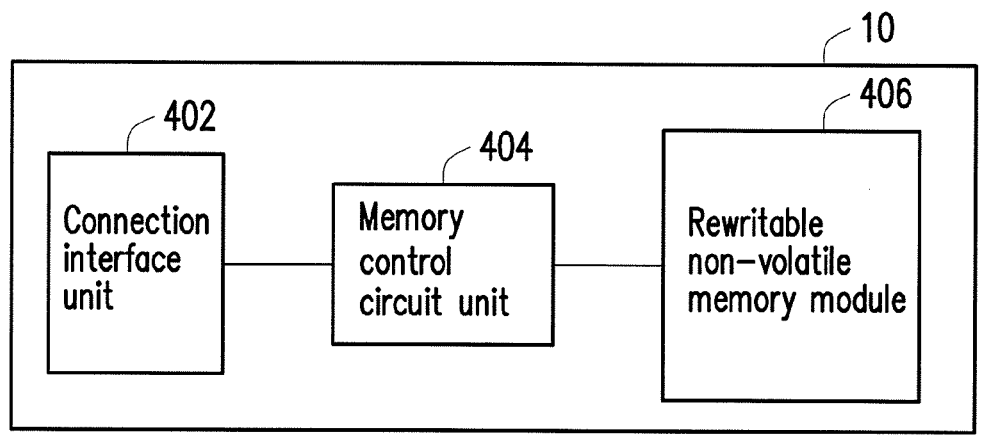
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the disclosure is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404. The connection interface unit 402 is configured to couple to the host system.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store more than one bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is a minimum unit for programming. That is, the physical programming unit is the minimum unit for writing data. For example, the physical programming unit is a physical page or a physical sector. When the physical programming unit is the physical page, the physical programming unit usually include a data bit area and a redundancy bit area. The data bit area includes multiple physical sectors configured to store user data, and the redundant bit area is configured to store system data (e.g., the error correcting code). In the present exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimal unit for erasing. Namely, each physical erasing unit contains the least number of memory cells to be erased together. For instance, the physical erasing unit is a physical block.

In the present exemplary embodiment, one or more bits in the rewritable non-volatile memory module 406 are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage is also known as "writing data into the memory cell" or "programming the memory cell". Each of the memory cells in the rewritable non-volatile memory module 406 has a plurality of storage states depended on changes in the threshold voltage. The storage state to which the memory cell belongs may be determined by applying a read voltage, so as to obtain the one or more bits stored in the memory cell.

Figure 5:
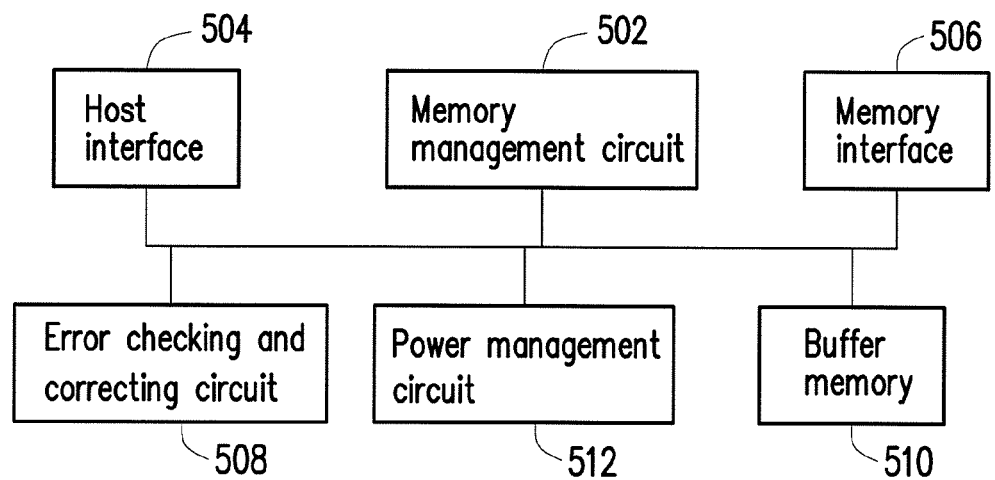
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands and the control commands are executed to perform various operations such as writing, reading and erasing data when the memory storage device 10 operates. Hereinafter, operations of the memory management circuit 502 are described as equivalent to describe operations of the memory control circuit unit 404.

In the present exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Later, the control commands are executed by the microprocessor unit to perfoiiii operations of writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data to be read from the rewritable non-volatile memory module 406. Each of the write command sequence, the read command sequence and the erase command sequence may include one or more program codes or command codes and instruct the rewritable non-volatile memory module 406 to perform the corresponding operations, such as writing, reading and erasing. In an exemplary embodiment, the memory management circuit 502 may further issue command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 through the host interface 504. In the present exemplary embodiment, the host interface 504 is compatible with the SATA standard. However, it should be understood that the present disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written to the rewritable non-volatile memory module 406 is converted into a format acceptable by the rewritable non-volatile memory module 406 through the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and command sequences configured to instruct performing various memory operations (e.g., for changing read voltage levels, performing a garbage collection operation, and so on). These command sequences are generated by the memory management circuit 502 and transmitted to the rewritable non-volatile memory module 406 through the memory interface 506, for example. The command sequences may include one or more signals, or data stored in the bus. The signals or the data may include command codes and programming codes. For example, information such as identification codes and memory addresses are included in the read command sequence.

In an exemplary embodiment, the memory control circuit unit 404 further includes an error checking and correcting circuit 508, a buffer memory 510 and a power management circuit 512.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data and the ECC and/or the EDC corresponding to the write command into the rewritable non-volatile memory module 406. Later, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

In the present exemplary embodiment, the memory management circuit 502 configures a plurality of logical units for mapping the physical erasing units in the rewritable non-volatile memory module 406. Herein, one logical unit may refer to one logical address, one logical programming unit, one logical erasing unit, or may be constituted by a plurality of consecutive or non-consecutive logical addresses. In addition, one logical unit may be mapped to one or more physical erasing units.

In the present exemplary embodiment, the memory management circuit 502 records a mapping relation (also known as a logical-physical mapping relation) between the logical units and the physical erasing units into at least one logical-physical mapping table. When the host system 11 intends to read the data from the memory storage device 10 or write the data into the memory storage device 10, the memory management circuit 502 may access the data in the memory storage device 10 according to the logical-physical mapping table.

In the present exemplary embodiment, the error checking and correcting circuit 508 supports a low-density parity-check (LDPC) code. For example, the error checking and correcting circuit 508 may use the LDPC code for encoding and decoding. In the LDPC code, a valid codeword is defined by using a check matrix (also known as a parity check matrix). Hereinafter, the parity check matrix is marked as a matrix H and a codeword is marked as V. According to Equation (1) below, if a product of the parity check matrix H multiplied by the codeword V is a zero vector, it means that the codeword V is the valid codeword. Therein, an operator ⊗ represents a mod 2 matrix multiplication. In other words, a null space of the matrix H includes all the valid codewords. However, the disclosure is not intended to limit the content of the codeword V. For example, the codeword V may also include the ECC or the EDC generated by using any algorithm.

$$V \otimes H^T = 0 \quad (1)$$

Herein, a dimension of the matrix H is k-by-n, and a dimension of the codeword V is 1-by-n, where k and n are positive integers. The codeword V includes message bits and parity bits, that is, the codeword V may be expressed by [U P], in which a vector U is constituted by the message bits, and a vector P is constituted by the parity bits. A dimension of the vector U is 1-by-(n-k), and a dimension of the vector P is 1-by-k. In one codeword, the parity bits are used for protecting the message bits and may be considered as the ECC or the EDC generated in correspondence to the message bits. Hereinafter, the vector P constituted by the parity bits is collectively regarded as the ECC for protecting the corresponding message bits. In addition, protecting the message bits refers to, for example, maintaining correctness of the message bits. For example, when data is read from the rewritable non-volatile memory module 406, the parity bits in said data may be used to correct possible errors in the corresponding message data.

In an exemplary embodiment, the message bits and the parity bits in one codeword are collectively known as data bits. For example, in an exemplary embodiment, the codeword V includes n bits, in which a length of the message bits is (n-k) bits, and a length of the parity bits is k bits (i.e., a code rate of the codeword V is (n-k)/n).

Generally, a generation matrix (hereinafter, marked as G) is used when encoding, so Equation (2) below can be satisfied for the vector U being an arbitrary vector. Herein, a dimension of the generation matrix G is (n-k)-by-n.

$$U \otimes G = [U\ P] = V \quad (2)$$

The codeword V generated by Equation (2) is the valid codeword. Therefore, Equation (2) may be substituted in Equation (1) to obtain Equation (3) below.

$$H \otimes G^T \otimes U^T = 0 \quad (3)$$

Since the vector U may be the arbitrary vector, Equation (4) below may definitely be satisfied. In other words, after the parity check matrix H is decided, the corresponding generation matrix G may also be decided.

$$H \otimes G^T = 0 \quad (4)$$

When decoding the codeword V, a parity check operation is first performed on the data bits in the codeword V by, for example, multiplying the parity check matrix H by the codeword V to generate one vector (hereinafter, marked as S, as shown in Equation (5) below). If the vector S is the zero vector (i.e., each element in the vector S is zero), the codeword V may be directly outputted. If the vector S is not the zero vector (i.e., at least one element in the vector S is not zero), it means that the codeword V includes at least one error and the codeword V is not the valid codeword.

$$V \otimes H^T = S \quad (5)$$

A dimension of the vector S is 1-by-k, in which each element is also known as a syndrome. The vector S is also known as syndrome data. If the codeword V is not the valid codeword, the error checking and correcting circuit 508 may perform a decoding operation to attempt correcting errors in the codeword V.

In the present exemplary embodiment, the parity check matrix H may be expressed by [C D], in which C is a first part of the parity check matrix H and D is a second part of the parity check matrix H. Accordingly, when the vector U is to be encoded, the error checking and correcting circuit 508 may generate the vector P according to Equation (6) below.

$$P = U \times C^T \times (D^{-1})^T \quad (6)$$

In the present exemplary embodiment, Equation (6) may further be disassembled into Equation (7) and Equation (8) below.

$$Y = U \times C^T \quad (7)$$

$$P = Y \times (D^{-1})^T \quad (8)$$

Herein, Y is transition data used for calculating the vector P. In comparison with Equation (6), performing an encoding operation of the LDPC code according to Equations (7) and (8) can improve operation efficiency of the error checking and correcting circuit 508.

In the present exemplary embodiment, in correspondence to the data to be encoded, the error checking and correcting circuit 508 sequentially performs a first stage encoding operation of the LDPC code and a second stage encoding operation of the LDPC code. For example, the first stage encoding operation of the LDPC code is corresponding to Equation (7) and configured to generate the transition data according to inputted data, and the second stage encoding operation of the LDPC code is corresponding to Equation (8) and configured to generate the corresponding ECC according to the obtained transition data.

It is noted that, Equations (7) and (8) provided above are merely an example for disassembling Equation (6), and the disclosure is not intended to limit how Equation (6) is disassembled. For example, in another exemplary embodiment, Equation (6) may also be disassembled in different ways to satisfy different design requirements.

Figure 6:
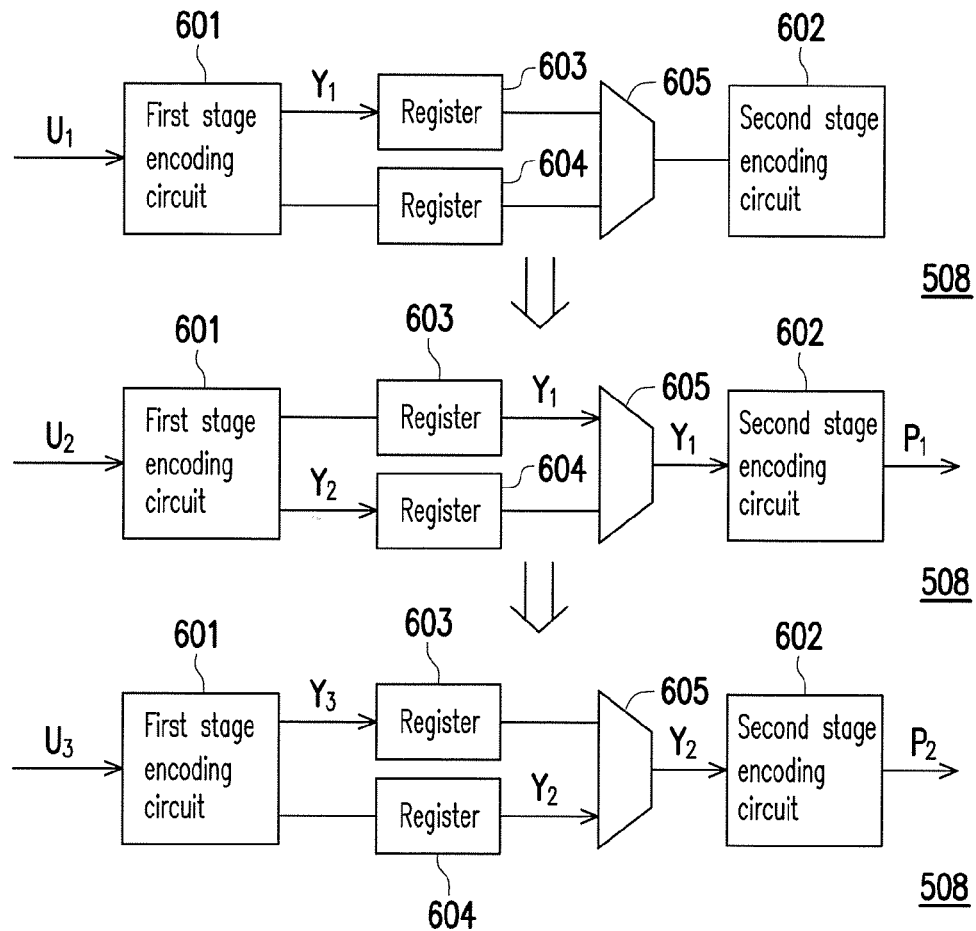
FIG. 6 is a schematic block diagram illustrating an error checking and correcting circuit according to an exemplary embodiment of the disclosure.

FIG. 6 is a schematic block diagram illustrating an error checking and correcting circuit according to an exemplary embodiment of the disclosure.

Referring to FIG. 6, in the present exemplary embodiment, the error checking and correcting circuit 508 includes a first stage encoding circuit 601, a second stage encoding circuit 602, a register 603, a register 604 and a multiplexer 605. The first stage encoding circuit 601 is configured to perform the first stage encoding operation of the LDPC code. The second stage encoding circuit 602 is configured to perform the second stage encoding operation of the LDPC code. For example, in the present exemplary embodiment, the first stage encoding circuit 601 is configured to perform data processing and operating operation corresponding to Equation (7), and the second stage encoding circuit 602 is configured to perfoiiii data processing and operating operation corresponding to Equation (8). However, in another exemplary embodiment, if Equation (6) is disassembled in different ways, internal hardware designs of the first stage encoding circuit 601 and the second stage encoding circuit 602 may also be correspondingly changed to support the corresponding data processing and operating operation.

The register 603 and the register 604 are coupled to the first stage encoding circuit 601 and configured to temporarily store data (e.g., the transition data) generated by the first stage encoding circuit 601. Specifications (e.g., data access mechanism, memory types and/or capacities) of the register 603 and the register 604 may be identical or different. In the present exemplary embodiment, the register 603 and the register 604 are registers independent from each other. However, in another exemplary embodiment, the register 603 and the register 604 may also refer to different storage areas in the same register. Further, the disclosure is not intended to limit a total number of the register 603 and the register 604. For example, in another exemplary embodiment, the total number of the register 603 and the register 604 may also be more.

Input terminals of the multiplexer 605 are coupled to the register 603 and the register 604, so as to receive data from one of the register 603 and the register 604. An output terminal of the multiplexer 605 is coupled to the second stage encoding circuit 602, so as to transmit the data temporarily stored in the register 603 or the register 604 to the second stage encoding circuit 602. In addition, the multiplexer 605 turns on a data transmission path between the register 603 and the second stage encoding circuit 602 or a data transmission path between the register 604 and the second stage encoding circuit 602 according to one control signal (not illustrated), for example. For example, said control signal may be generated by one control circuit (not illustrated) in the error checking and correcting circuit 508 according to operating states of the error checking and correcting circuit 508 or generated by the memory management circuit 502, and the disclosure is not limited thereto.

In the present exemplary embodiment, after write data $U_1$ is received by the memory management circuit 502 from the host system 11, the write data $U_1$ is inputted into the error checking and correcting circuit 508 for encoding, so to as generate the corresponding ECC. For example, the first stage encoding circuit 601 receives the write data $U_1$ and performs the first stage encoding operation of the LDPC code on the write data $U_1$. According to an execution result of the first stage encoding operation, the first stage encoding circuit 601 generates transition data $Y_1$ corresponding to the write data $U_1$. For example, the transition data $Y_1$ corresponds to an operating result obtained by substituting the write data $U_1$ in Equation (7). Then, according to states of the registers 603 and 604, the first stage encoding circuit 601 temporarily stores transition data $Y_1$ into one of the registers 603 and 604. For example, if both the registers 603 and 604 are not stored with data when the transition data $Y_1$ is generated, it means that the registers 603 and 604 are both in an idle state (or a rewritable state) and thus the first stage encoding circuit 601 can temporarily store the transition data $Y_1$ in the register 603.

In the present exemplary embodiment, in correspondence to the transition data $Y_1$ being temporarily stored in the register 603, the register 603 is set to a non-idle state (or a busy state). For example, said non-idle state (or the busy state) remains until the transition data $Y_1$ in the register 603 is completely read by the second stage encoding circuit 602 and/or an ECC $P_1$ is completely generated by the second stage encoding circuit 602.

After temporarily storing the transition data $Y_1$ into the register 603, the second stage encoding circuit 602 receives the transition data $Y_1$ from the register 603 via the multiplexer 605 and perfoiiis the second stage encoding operation of the LDPC code on the transition data $Y_1$. According to an execution result of the second stage encoding operation, the second stage encoding circuit 602 generates the ECC $P_1$ corresponding to the write data $U_1$. Herein, the ECC $P_1$ is configured to protect the write data $U_1$. For example, the ECC $P_1$ corresponds to an operating result obtained by substituting the transition data $Y_1$ in Equation (8). The memory management circuit 502 sends one write command sequence to the rewritable non-volatile memory module 406 to instruct storing the ECC $P_1$ along with the corresponding write data $U_1$ into the rewritable non-volatile memory module 406.

In the present exemplary embodiment, the memory management circuit 502 further receives write data $U_2$ from the host system 11. For example, the write data $U_2$ is transmitted to the memory storage device 10 successively after the write data $U_1$ is transmitted. The write data $U_2$ is inputted into the error checking and correcting circuit 508 for encoding, so as to generate the corresponding ECC. For example, during a time period of perfoiming the second stage encoding operation of the LDPC code on the transition data $Y_1$ by the second stage encoding circuit 602, the first stage encoding circuit 601 receives the write data $U_2$ and performs the first stage encoding operation of the LDPC code on the write data $U_2$. According to an execution result, the first stage encoding circuit 601 generates transition data $Y_2$ corresponding to the write data $U_2$. For example, the transition data $Y_2$ corresponds to an operating result obtained by substituting the write data $U_2$ in Equation (7).

During a time period of performing the first stage encoding operation of the LDPC code on the write data $U_1$ by the first stage encoding circuit 601, the second stage encoding circuit 602 may continuously read the transition data $Y_1$ from the register 603, so as to perform the second stage encoding operation on the transition data $Y_1$. Therefore, during a time period of performing the second stage encoding operation on the transition data $Y_1$ by the second stage encoding circuit 602, the first stage encoding circuit 601 skips the register 603 in the non-idle state (or the busy state) and uses the register 604 in the idle state (or the rewritable state) to temporarily store the transition data Y2.

In the present exemplary embodiment, in correspondence to the transition data $Y_2$ being temporarily stored in the register 604, the register 604 is also set to the non-idle state (or the busy state). For example, said non-idle state (or the busy state) remains until the transition data $Y_2$ in the register 604 is completely read by the second stage encoding circuit 602 and/or an ECC $P_2$ is completely generated by the second stage encoding circuit 602.

After temporarily storing the transition data $Y_2$ into the register 604, if the ECC $P_1$ is already obtained by the second stage encoding circuit 602, the second stage encoding circuit 602 successively reads the transition data $Y_2$ from the register 604 via the multiplexer 605 and perfoinis the second stage encoding operation of the LDPC code on the transition data $Y_2$. According to an execution result, the second stage encoding circuit 602 generates the ECC $P_2$ corresponding to the write data $U_2$. Herein, the ECC $P_2$ is configured to protect the write data $U_2$. For example, the ECC $P_2$ corresponds to an operating result obtained by substituting the transition data $Y_2$ in Equation (8). The memory management circuit 502 sends another write command sequence to the rewritable non-volatile memory module 406 to instruct storing the ECC $P_2$ along with the corresponding write data $U_2$ into the rewritable non-volatile memory module 406.

In the present exemplary embodiment, after the transition data $Y_1$ temporarily stored in the register 603 is completely read and/or the ECC $P_1$ is completely generated by the second stage encoding circuit 602, the state of the register 603 switches from the non-idle state (or the busy state) to the idle state (or the rewritable state). In the idle state (or the rewritable state), new data may be temporarily stored into the register 603.

In the present exemplary embodiment, the memory management circuit 502 may further receive write data $U_3$ from the host system 11. For example, the write data $U_3$ is transmitted to the memory storage device 10 successively after the write data $U_2$ is transmitted. The write data $U_3$ is inputted into the error checking and correcting circuit 508 for encoding, so as to generate the corresponding ECC. For example, during a time period of performing the second stage encoding operation of the LDPC code on the transition data $Y_2$ by the second stage encoding circuit 602, the first stage encoding circuit 601 receives the write data $U_3$ and performs the first stage encoding operation of the LDPC code on the write data $U_3$. According to an execution result, the first stage encoding circuit 601 generates transition data $Y_3$ corresponding to the write data $U_3$.

During a time period of performing the first stage encoding operation of the LDPC code on the write data $U_3$ by the first stage encoding circuit 601, the second stage encoding circuit 602 may continuously read the transition data $Y_2$ from the register 604, so as to perform the second stage encoding operation on the transition data $Y_2$. Therefore, during a time period of performing the second stage encoding operation on the transition data $Y_2$ by the second stage encoding circuit 602, the first stage encoding circuit 601 skips the register 604 in the busy state and uses the register 603 in the idle state (or the rewritable state) to temporarily store the transition data $Y_3$. Then, after the ECC $P_2$ is completely generated by the second stage encoding circuit 602, the second stage encoding circuit 602 may successively read the transition data $Y_3$ from the register 603 via the multiplexer 605 and perform the second stage encoding operation of the LDPC code on the transition data $Y_3$.

Figure 7:
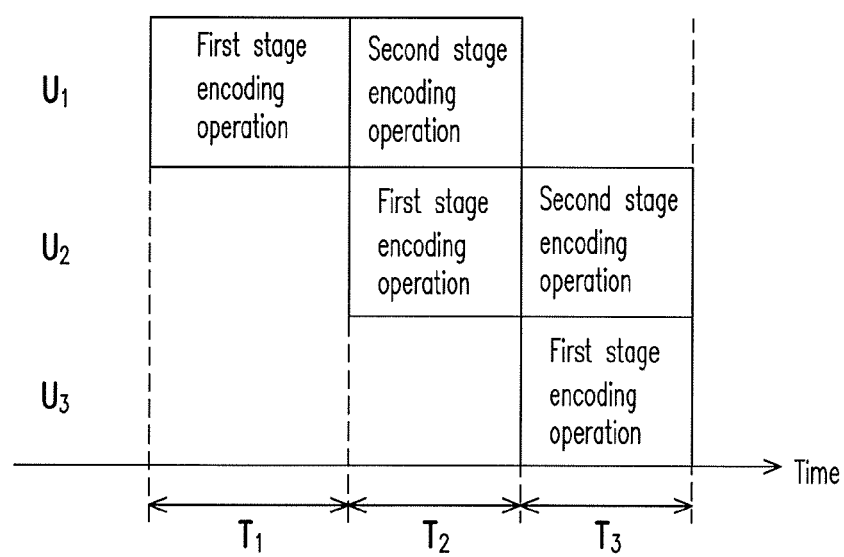
FIG. 7 and FIG. 8 are schematic diagrams illustrating timing sequence of operations according to an exemplary embodiment of the disclosure.
Figure 8:
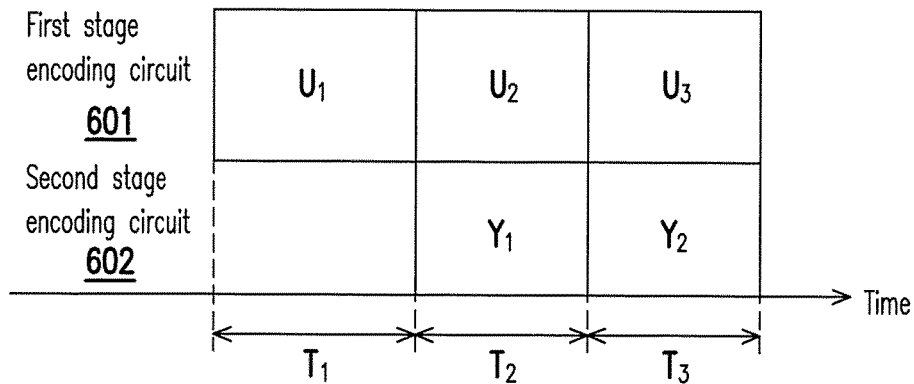

FIG. 7 and FIG. 8 are schematic diagrams illustrating timing sequence of operations according to an exemplary embodiment of the disclosure.

Referring to FIG. 6, FIG. 7 and FIG. 8 together, the first stage encoding operation corresponding to the write data $U_1$ is performed within a time range $T_1$. For example, the first stage encoding circuit 601 processes the write data $U_1$ within the time range $T_1$. Then, the second stage encoding operation corresponding to the write data $U_1$ and the first stage encoding operation corresponding to the write data $U_2$ are simultaneously performed within a time range $T_2$ succeeding to the time range $T_1$. For example, after the transition data $Y_1$ is generated, the first stage encoding circuit 601 successively processes the write data $U_2$; meanwhile, the second stage encoding circuit 602 processes the transition data $Y_1$. Then, the second stage encoding operation corresponding to the write data $U_2$ and the first stage encoding operation corresponding to the write data $U_3$ are simultaneously performed within a time range $T_3$ succeeding to the time range $T_2$. For example, after the transition data $Y_2$ is generated, the first stage encoding circuit 601 successively processes the write data $U_3$; meanwhile, the second stage encoding circuit 602 processes the transition data $Y_2$.

Traditionally, one encoding circuit is only capable of encoding one write data each time before the corresponding ECC is generated. For example, in correspondence to one write data, a plurality of encoding stages divided from the same encoding operation are sequentially performed. The next write data to be encoded can be inputted to one encoding circuit only after the last encoding stage for the previous write data is completed by the encoding circuit (i.e., after the ECC is completely generated). Even if the encoding stages in one encoding operation are implemented by different circuit modules in the encoding circuit, respectively, the circuit module in charge of the first encoding stage still must wait for the circuit module in charge of the last encoding stage to complete its operation before proceeding to process the next write data. Therefore, in the same encoding operation, a circuit module that already completed his own operation is usually in the idle state, and lead to waste of system resources.

However, according to the exemplary embodiments of FIG. 6 to FIG. 8, when the previous write data enters the next encoding stage in one encoding operation, new write data (i.e., the data to be encoded) or the next write data is able to enter the previous encoding stage in the same encoding operation. Therefore, even if the error checking and correcting circuit 508 includes only one circuit module in charge of the first stage encoding and only one circuit module in charge of the second stage encoding, the error checking and correcting circuit 508 may still simultaneously perform encodings for at least two data which are sequentially received. Accordingly, a time spent of the circuit modules in charge of different encoding stages for waiting each other may be reduced, usage efficiency of those circuit modules may be improved and/or the overall data processing efficiency of the error checking and correcting circuit 508 may be improved.

In an exemplary embodiment, the first stage encoding circuit 601 may also be configured to perform a syndrome generating operation (or the parity check operation including the syndrome generating operation). For example, after the transition data is outputted by the first stage encoding circuit 601, during the time period of performing the corresponding second stage encoding operation on such transition data by the second stage encoding circuit 602, the first stage encoding circuit 601 may successively perform the syndrome generating operation on one specific read data from the rewritable non-volatile memory module 406. For example, the syndrome generating operation is configured to generate the syndrome data, and the syndrome data is used for determining whether one codeword includes any error.

Figure 9:
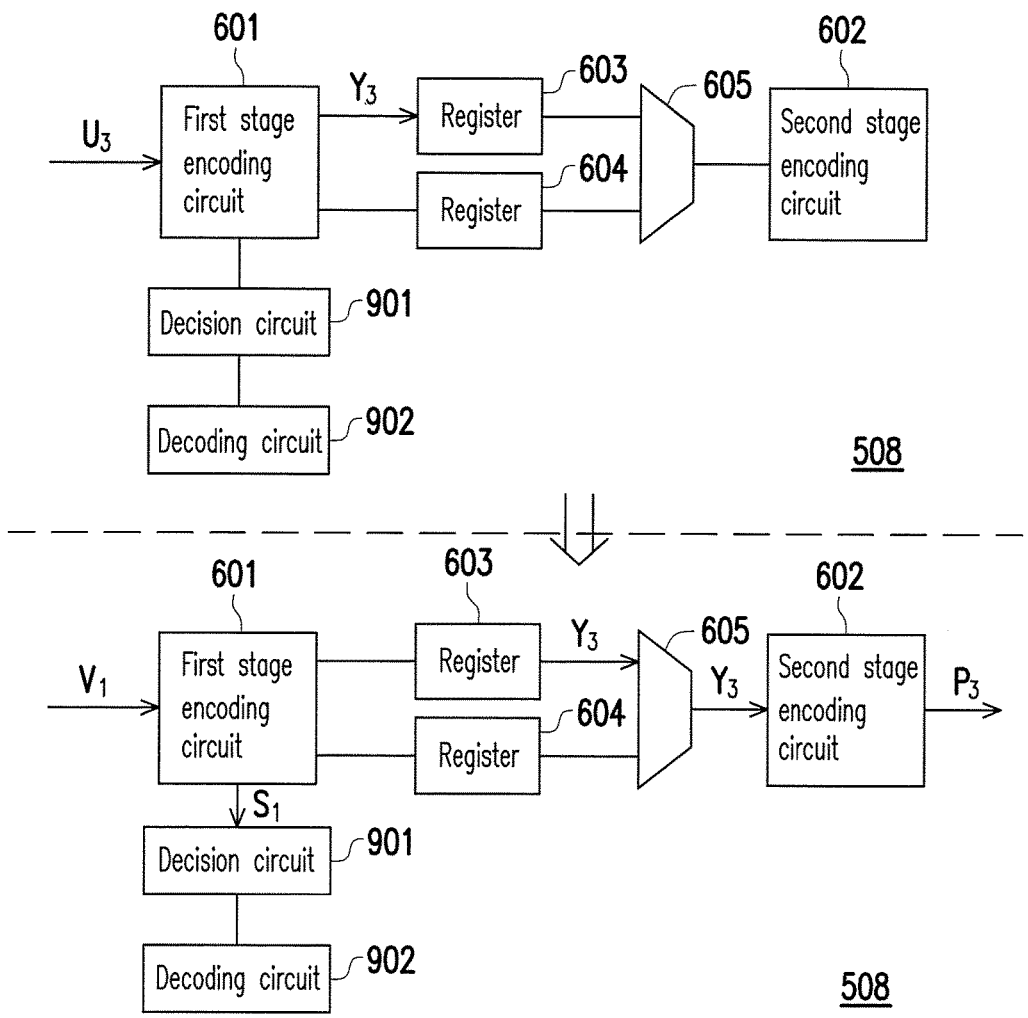
FIG. 9 is a schematic block diagram illustrating the error checking and correcting circuit according to another exemplary embodiment of the disclosure.

FIG. 9 is a schematic block diagram illustrating the error checking and correcting circuit according to another exemplary embodiment of the disclosure.

Referring to FIG. 9, in the present exemplary embodiment, the error checking and correcting circuit 508 includes a first stage encoding circuit 601, a second stage encoding circuit 602, a register 603, a register 604, a multiplexer 605, a decision circuit 901 and a decoding circuit 902. Herein, the first stage encoding circuit 601, the second stage encoding circuit 602, the register 603, the register 604 and the multiplexer 605 are identical or similar to the elements with the same reference numbers in the exemplary embodiment of FIG. 6. The decision circuit 901 is coupled to the first stage encoding circuit 601. The decoding circuit 902 is coupled to the decision circuit 901 and the memory management circuit 502.

In the present exemplary embodiment, the first stage encoding circuit 601 receives the write data $U_3$ and performs the first stage encoding operation of the LDPC code on the write data $U_3$. According to an execution result, the first stage encoding circuit 601 generates the transition data $Y_3$ corresponding to the write data $U_3$. Then, the transition data $Y_3$ is temporarily stored into the register 603. The second stage encoding circuit 602 reads the transition data $Y_3$ from the register 603 via the multiplexer 605 and performs the second stage encoding operation of the LDPC code on the transition data $Y_3$. According to an execution result, the second stage encoding circuit 602 generates the ECC $P_3$ corresponding to the write data $U_3$. Herein, the ECC $P_3$ is configured to protect the write data $U_3$. The memory management circuit 502 sends another write command sequence to the rewritable non-volatile memory module 406 to instruct storing the ECC $P_3$ along with the corresponding write data $U_3$ into the rewritable non-volatile memory module 406.

In the present exemplary embodiment, the memory management circuit 502 receives read data $V_1$ from the rewritable non-volatile memory module 406. For example, the read data $V_1$ is data transmitted by the rewritable non-volatile memory module 406 in response to the read command sequence issued by the memory management circuit 502. For example, the read data $V_1$ may be data to be read as instructed by the host system 11 or data collected in a data merge operation (e.g., a garbage collection process) of the rewritable non-volatile memory module 406 as performed by the memory management circuit 502. The memory management circuit 502 inputs the read data $V_1$ into the error checking and correcting circuit 508 for error checking.

In the exemplary embodiment of FIG. 9, during a time period of performing the second stage encoding operation of the LDPC code on the transition data $Y_3$ by the second stage encoding circuit 602, the first stage encoding circuit 601 receives the read data $V_1$ and performs the syndrome generating operation corresponding to the read data $V_1$. According to an execution result of the syndrome generating operation, the first stage encoding circuit 601 generates syndrome data $S_1$ corresponding to the read data $V_1$. Herein, the syndrome data $S_1$ includes a plurality of syndromes. For example, the syndrome data $S_1$ corresponds to an operating result obtained by substituting the codeword corresponding to the read data $V_1$ in Equation (5).

The decision circuit 901 receives the syndrome data $S_i$ and determines whether the syndrome data $S_1$ matches a preset condition. For example, the preset condition is each syndrome in the syndrome data $S_1$ being zero. If the syndrome data $S_1$ matches the preset condition, it means that the codeword corresponding to the read data $V_1$ is the valid codeword (e.g., such codeword is unlikely to include any error), and thus the error checking and correcting circuit 508 can output the codeword. However, if the syndrome data $S_1$ does not match the preset condition, it means that the codeword corresponding to the read data $V_1$ is not the valid codeword (e.g., the codeword may include at least one error), and thus the decoding circuit 902 can perform a decoding operation of the LDPC code on the codeword. For example, the decoding circuit 902 may perform the corresponding decoding operation on the codeword by using information related to channel status such as LLR (Log Likelihood Ratio), so as to attempt correcting errors in the codeword.

It is noted that, in an exemplary embodiment, the syndrome generating operation is included in the parity check operation of the LDPC code. Accordingly, the first stage encoding circuit 601 may complete the parity check operation in cooperation with the decision circuit 901. Alternatively, in another exemplary embodiment, the decision circuit 901 may also be included in the first stage encoding circuit 601, so that the first stage encoding circuit 601 may complete the parity check operation alone.

Figure 10:
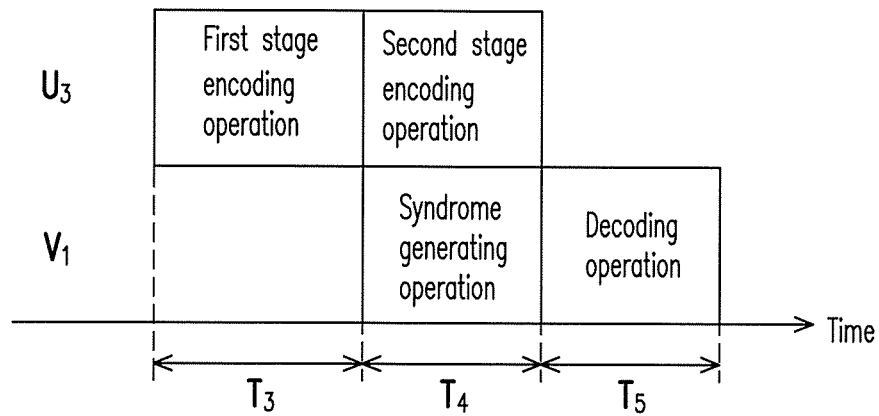
FIG. 10 and FIG. 11 are schematic diagrams illustrating timing sequence of operations according to another exemplary embodiment of the disclosure.
Figure 11:
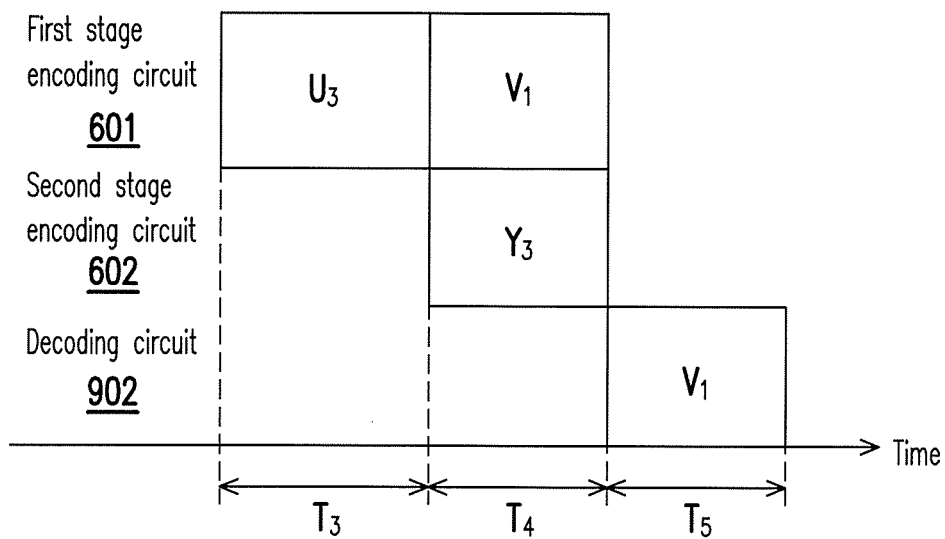

FIG. 10 and FIG. 11 are schematic diagrams illustrating timing sequence of operations according to another exemplary embodiment of the disclosure.

Referring to FIG. 9, FIG. 10 and FIG. 11 together, the first stage encoding operation corresponding to the write data $U_3$ is performed within a time range $T_3$. For example, the first stage encoding circuit 601 processes the write data $U_3$ within the time range $T_3$. Then, the second stage encoding operation corresponding to the write data $U_3$ and the syndrome generating operation (or the parity check operation) corresponding to the read data $V_1$ may be simultaneously performed within a time range $T_4$ succeeding to the time range $T_3$. For example, after the transition data $Y_3$ is generated, the first stage encoding circuit 601 successively processes the read data $V_1$; meanwhile, the second stage encoding circuit 602 processes the transition data $Y_3$. Then, if it is determined that the codeword corresponding to the read data $V_1$ is not the valid codeword, the decoding circuit 902 performs the decoding operation on the codeword corresponding to the read data $V_1$ within a time range $T_5$ succeeding to the time range $T_4$. By doing so, when the host system 11 (or the memory management circuit 502) simultaneously performs the write and read operations on data in short period time, the error checking and correcting circuit 508 having only one first stage encoding circuit 601 is still capable of simultaneously performing the encoding and decoding operations on the write data from the host system 11 and the read data from the rewritable non-volatile memory module 406, respectively. As such, the data processing efficiency of the error checking and correcting code 508 can be improved.

In an exemplary embodiment, the rewritable non-volatile memory module 406 includes a plurality of channels, and the memory interface (e.g., the memory interface 506 of FIG. 5) may transmit data to the rewritable non-volatile memory module 406 and receives data from the rewritable non-volatile memory module 406 via the channels. For example, the memory management circuit 502 may sequentially access the rewritable non-volatile memory module 406 via the same channel or different channels. For example, sequential write data (e.g., the write data $U_1$ and $U_2$ of FIG. 6) and the corresponding ECCs (e.g., the ECCs $P_1$ and $P_2$ of FIG. 6) may be transmitted to the rewritable non-volatile memory module 406 for storage via the same channel or different channels. In the case where different channels are used for transmitting data, at least one of the write data $U_1$ and the corresponding ECC $P_1$ in FIG. 6 is, for example, transmitted to the rewritable non-volatile memory module 406 via one specific channel among the channels, whereas at least one of the write data $U_2$ and the corresponding ECC $P_2$ is transmitted to the rewritable non-volatile memory module 406 via another channel among the channels. Further, in an exemplary embodiment of FIG. 9, if at least one of the write data $U_3$ and the corresponding ECC $P_3$ is transmitted to the rewritable non-volatile memory module 406 via one specific channel among the channels, it is also possible that the read data $V_1$ is received from the rewritable non-volatile memory module 406 via another channel among the channels. By writing and/or reading data via the multiple channels in a short period of time, data access efficiency of the memory storage device 10 can be improved.

Generally, if the data processing efficiency of the encoding/decoding circuit is insufficient, more encoding/decoding circuits need to be disposed when there are more transmission channels in the memory device. Otherwise, if a total number of the encoding/decoding circuit is insufficient, a data transmission bandwidth of the memory device is usually limited since the data from the host system or the memory cannot be processed by the encoding/decoding circuit in real time. However, according to the foregoing exemplary embodiments, because the data processing efficiency of the error checking and correcting circuit 508 is improved, one error checking and correcting circuit 508 can be used for processing the data transmitted via more channels. In addition, the number of the error checking and correcting circuit 508 may also be two, three or more, instead of one. In comparison with the traditional encoding/decoding circuit, when a total number of the channels in the memory storage device 10 increases, the number of the error checking and correcting circuits 508 may be controlled within a reasonable range without being significantly increased.

It is noted that, the exemplary embodiments of FIG. 6 to FIG. 11 are merely used to describe possible circuit layouts and related operations of the error checking and correcting circuit 508 rather than limit the scope of the disclosure. For example, although the exemplary embodiments of FIG. 6 to FIG. 8 are described by using the example in which the write data $U_1$ to $U_3$ are sequentially received from the host system 11 and the write data $U_1$ to $U_3$ are sequentially encoded, the related operations may also be applied to operation scenarios where more or less write data are to be received. Alternatively, although the exemplary embodiments of FIG. 9 to FIG. 11 are described as continuation to the exemplary embodiment of FIG. 6, the exemplary embodiments of FIG. 9 to FIG. 11 may also be implemented separately. Further, in another exemplary embodiment, more circuit elements may also be added to FIG. 6 or FIG. 9, and part of the circuit elements (e.g., the registers 603 and 604, and the multiplexer 605) in FIG. 6 or FIG. 9 may also be replaced by other circuit elements having identical or similar functions.

Figure 12:
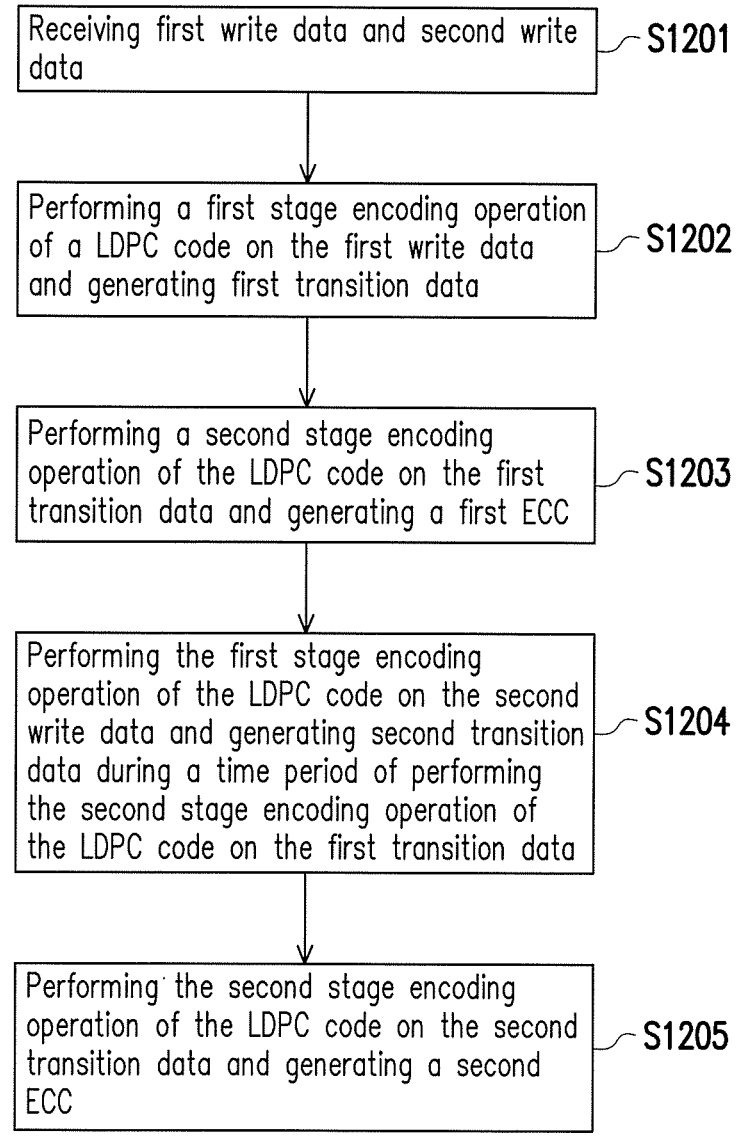
FIG. 12 is a flowchart illustrating a data processing method according to an exemplary embodiment of the disclosure.

FIG. 12 is a flowchart illustrating a data processing method according to an exemplary embodiment of the disclosure.

Referring to FIG. 12, in step S1201, the memory management circuit 502 receives first write data (e.g., the write data $U_1$ in FIG. 6) and second write data (e.g., the write data $U_2$ in FIG. 6). For example, the second write data is received from the host system 11 successively after the first write data is received. In step S1202, the first stage encoding circuit 601 performs a first stage encoding operation of a LDPC code on the first write data and generates first transition data (e.g., the transition data $Y_1$ in FIG. 6). In step S1203, the second stage encoding circuit 602 performs a second stage encoding operation of the LDPC code on the first transition data and generates a first ECC (e.g., the ECC $P_1$ in FIG. 6). In step S1204, during a time period of perfoiining the second stage encoding operation of the LDPC code on the first transition data by the second stage encoding circuit 602, the first stage encoding circuit 601 performs the first stage encoding operation of the LDPC code on the second write data and generates second transition data (e.g., the transition data $Y_2$ in FIG. 6). In step S1205, the second stage encoding circuit 602 performs the second stage encoding operation of the LDPC code on the second transition data and generates a second ECC (e.g., the ECC $P_2$ in FIG. 6).

Figure 13:
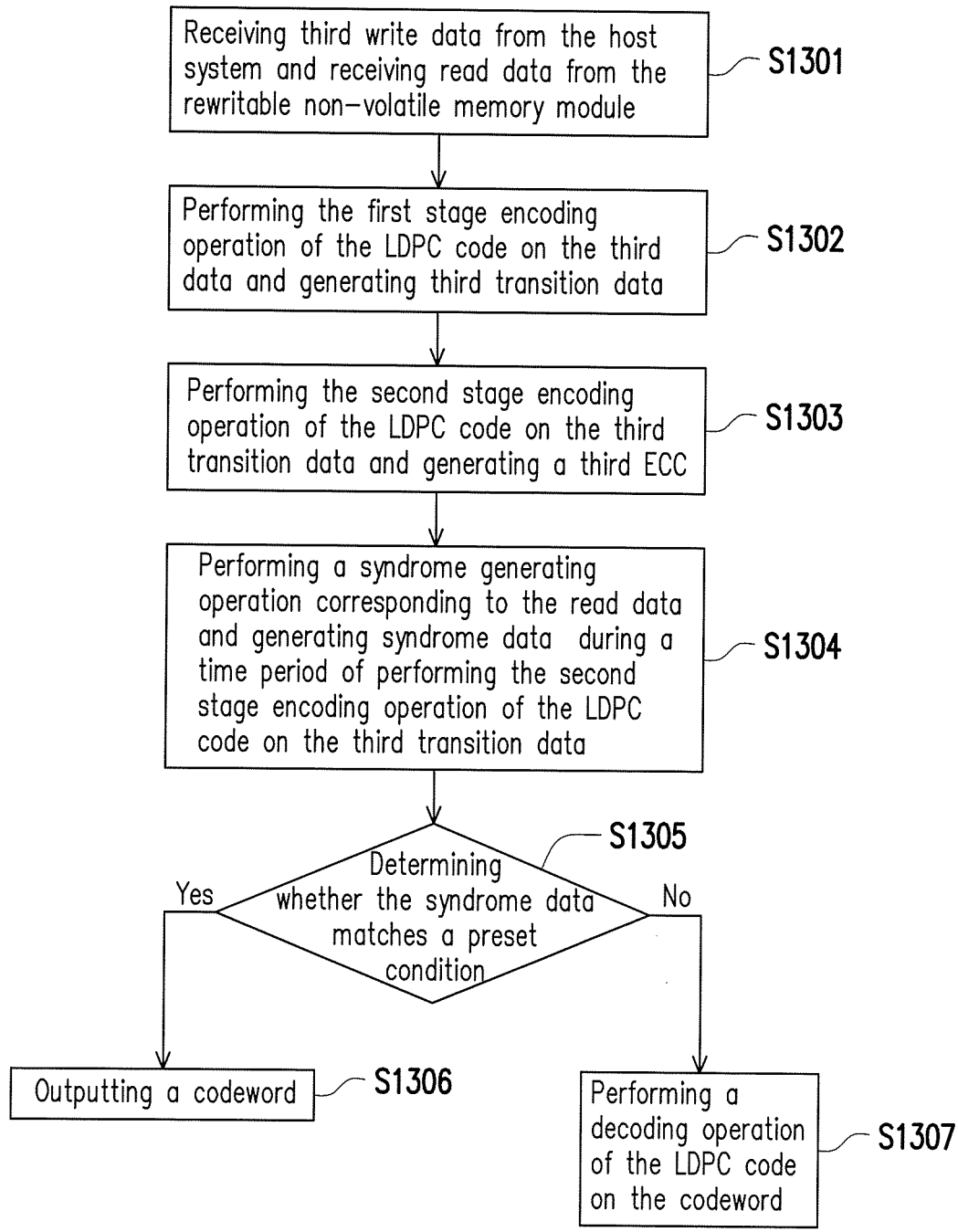
FIG. 13 is a flowchart illustrating a data processing method according to another exemplary embodiment of the disclosure.

FIG. 13 is a flowchart illustrating a data processing method according to another exemplary embodiment of the disclosure.

Referring to FIG. 13, in step S1301, the memory management circuit 502 receives third write data (e.g., the write data $U_3$ in FIG. 9) from the host system 11 and receives read data (e.g., the read data $V_1$ in FIG. 9) from the rewritable non-volatile memory module 406. In step S1302, the first stage encoding circuit 601 performs the first stage encoding operation of the LDPC code on the third data and generates third transition data (e.g., the transition data $Y_3$ in FIG. 9). In step S1303, the second stage encoding circuit 602 performs the second stage encoding operation of the LDPC code on the third transition data and generates a third ECC (e.g., the ECC $P_3$ in FIG. 9). In step S1304, during a time period of performing the second stage encoding operation of the LDPC code on the third transition data by the second stage encoding circuit 602, the first stage encoding circuit 601 performs a syndrome generating operation corresponding to the read data and generates syndrome data (e.g., the syndrome data $S_1$ in FIG. 9). In step S1305, the decision circuit 901 determines whether the syndrome data matches a preset condition. If yes, in step S1306, the first stage encoding circuit 601 outputs the current codeword. If no, in step S1307, the decoding circuit 902 performs a decoding operation of the LDPC code on the current codeword.

Nevertheless, each of steps depicted in FIG. 12 and FIG. 13 have been described in detail as above, thus related description thereof is not repeated hereinafter. It should be noted that, the steps depicted in FIG. 12 and FIG. 13 may be implemented as a plurality of program codes or circuits, which are not particularly limited in the disclosure. Moreover, the methods disclosed in FIG. 12 and FIG. 13 may be implemented with reference to above embodiments, or may be implemented separately, which are not particularly limited in the disclosure.

In summary, in correspondence to the received first write data, the first stage encoding operation of the LDPC code is performed to generate the first transition data. Then, in correspondence to the first transition data, the second stage encoding operation of the LDPC code is successively performed to generate the first ECC for protecting the first write data. Further, during the time period of performing the second stage encoding operation on the first transition data, the first stage encoding operation of the LDPC code corresponding to the received second write data may also be simultaneously performed. As a result, the idle time of at least part of the encoding circuit can be reduced and the data processing efficiency corresponding to the LDPC code can also be improved.

The previously described exemplary embodiments of the present disclosure have the advantages aforementioned, wherein the advantages aforementioned not required in all versions of the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A data processing method for encoding data stored in a rewritable non-volatile memory module, and the data processing method comprising:
   receiving first write data;
   performing, by a first stage encoding circuit, a first stage encoding operation of a low-density parity-check (LDPC) code on the first write data so as to generate first transition data;
   performing, by a second stage encoding circuit, a second stage encoding operation of the LDPC code on the first transition data so as to generate a first error correcting code (ECC), wherein the first ECC and the first write data is stored into the rewritable non-volatile memory module;
   receiving second write data;
   synchronously performing, by the first stage encoding circuit, the first stage encoding operation of the LDPC code on the second write data during a time period when the second stage encoding operation of the LDPC code on the first transition data is performed by the second stage encoding circuit; and
   controlling a transmission path between the first stage encoding circuit and the second stage encoding circuit by a multiplexer,
   wherein the first stage encoding operation is an encoding operation related to a first part of a parity check matrix, and the second stage encoding operation is an encoding operation related to a second part of the parity check matrix.

2. The data processing method of claim 1, further comprising:
   performing the second stage encoding operation of the LDPC code on second transition data after obtaining the first ECC and generating a second ECC, wherein the second transition data is generated by performing the first stage encoding operation of the LDPC code on the second write data,
   wherein the second ECC and the second write data is stored into the rewritable non-volatile memory module.

3. The data processing method of claim 1, wherein the first stage encoding operation of the LDPC code and a syndrome generating operation are performed by a same circuit module of an error checking and correcting circuit,
   wherein the syndrome generating operation is configured to generate syndrome data,
   wherein the syndrome data is used for determining whether a codeword includes an error.

4. The data processing method of claim 1, further comprising:
   receiving third write data;
   performing the first stage encoding operation of the LDPC code on the third write data and generating third transition data;
   performing the second stage encoding operation of the LDPC code on the third transition data and generating a third ECC, wherein the third ECC and the third write data is stored into the rewritable non-volatile memory module;
   receiving read data from the rewritable non-volatile memory module;
   performing a syndrome generating operation corresponding to the read data and generating syndrome data during a time period of performing the second stage encoding operation of the LDPC code on the third transition data; and
   performing a decoding operation of the LDPC code on the read data if the syndrome data does not match a preset condition.

5. The data processing method of claim 1, further comprising:
   configuring a first register, a second register and a multiplexer, wherein the multiplexer is coupled to the first register and the second register;
   temporarily storing the first transition data by using the first register;
   temporarily storing the second transition data by using the second register during the time period of performing the second stage encoding operation of the LDPC code on the first transition data; and
   receiving data for the second stage encoding operation of the LDPC code from one of the first register and the second register via the multiplexer.

6. The data processing method of claim 1, wherein the first stage encoding operation of the LDPC code corresponds to a calculation of:

$$Y = U \times C^T,$$

wherein U corresponds to the first write data, C corresponds to the first part of the parity check matrix, and Y corresponds to the first transition data,
wherein the second stage encoding operation of the LDPC code corresponds to a calculation of:

$$P = Y \times (D^{-1})^T,$$

wherein D corresponds to the second part of the parity check matrix, and P corresponds to the first ECC.

7. The data processing method of claim 4, wherein the rewritable non-volatile memory module has a plurality of channels,
   wherein at least one of the third ECC and the third write data is stored into the rewritable non-volatile memory module via a first channel among the channels,
   wherein the read data is received from the rewritable non-volatile memory module via a second channel among the channels.

8. A memory storage device, comprising:
   a connection interface unit, configured to couple to a host system;
   a rewritable non-volatile memory module; and
   a memory control circuit unit, coupled to the connection interface unit and the rewritable non-volatile memory module,
   wherein the memory control circuit unit is configured to receive first write data from the host system,
   wherein the memory control circuit unit is further configured to perform, by a first stage encoding circuit, a first stage encoding operation of a LDPC code on the first write data so as to generate first transition data, wherein the memory control circuit unit is further configured to perform, by a second stage encoding circuit, a second stage encoding operation of the LDPC code on the first transition data so as to generate a first ECC, wherein the memory control circuit unit is further configured to send a first write command sequence which instructs to store the first ECC and the first write data into the rewritable non-volatile memory module, wherein the memory control circuit unit is further configured to receive second write data from the host system, wherein the memory control circuit unit is further configured to synchronously perform, by the first stage encoding circuit, the first stage encoding operation of the LDPC code on the second write data during a time period when the second stage encoding operation of the LDPC code on the first transition data is performed by the second stage encoding circuit, wherein a multiplexer is coupled between the first stage encoding circuit and the second stage encoding circuit, and the multiplexer is configured to control a transmission path between the first stage encoding circuit and the second stage encoding circuit, wherein the first stage encoding operation is an encoding operation related to a first part of a parity check matrix, and the second stage encoding operation is an encoding operation related to a second part of the parity check matrix.

9. The memory storage device of claim 8, wherein the memory control circuit unit is further configured to perform the second stage encoding operation of the LDPC code on second transition data after obtaining the first ECC and generate a second ECC, wherein the second transition data is generated by performing the first stage encoding operation of the LDPC code on the second write data by the memory control circuit unit, wherein the memory control circuit unit is further configured to send a second write command sequence which instructs to store the second ECC and the second write data into the rewritable non-volatile memory module.

10. The memory storage device of claim 8, wherein the memory control circuit unit comprises:

a first stage encoding circuit, configured to perform the first stage encoding operation of the LDPC code; and a second stage encoding circuit, coupled to the first stage encoding circuit and configured to perform the second stage encoding operation of the LDPC code, wherein the first stage encoding circuit is further configured to perform a syndrome generating operation and generate syndrome data, wherein the syndrome data is used for determining whether a codeword includes an error.

11. The memory storage device of claim 8, wherein the memory control circuit unit is further configured to receive third write data, wherein the memory control circuit unit is further configured to perform the first stage encoding operation of the LDPC code on the third write data and generate third transition data, wherein the memory control circuit unit is further configured to perform the second stage encoding operation of the LDPC code on the third transition data and generate a third ECC, wherein the memory control circuit unit is further configured to send a third write command sequence which instructs to store the third ECC and the third write data into the rewritable non-volatile memory module, wherein the memory control circuit unit is further configured to receive read data from the rewritable non-volatile memory module, wherein the memory control circuit unit is further configured to perform a syndrome generating operation corresponding to the read data and generate syndrome data during a time period of performing the second stage encoding operation of the LDPC code on the third transition data, wherein the memory control circuit unit is further configured to perform a decoding operation of the LDPC code on the read data if the syndrome data does not match a preset condition.

12. The memory storage device of claim 8, wherein the memory control circuit unit comprises:

a first register, configured to temporarily store the first transition data;

a second register, configured to temporarily store the second transition data during the time period of performing the second stage encoding operation of the LDPC code on the first transition data by the memory control circuit unit; and a multiplexer, coupled to the first register and the second register, wherein the multiplexer is configured to receive data for the second stage encoding operation of the LDPC code from one of the first register and the second register.

13. The memory storage device of claim 8, wherein the first stage encoding operation of the LDPC code corresponds to a calculation of:

$$Y = U \times C^T,$$

wherein U corresponds to the first write data, C corresponds to the first part of the parity check matrix, and Y corresponds to the first transition data, wherein the second stage encoding operation of the LDPC code corresponds to a calculation of:

$$P = Y \times (D^{-1})^T,$$

wherein D corresponds to the second part of the parity check matrix, and P corresponds to the first ECC.

14. The memory storage device of claim 11, wherein the rewritable non-volatile memory module has a plurality of channels, wherein at least one of the third ECC and the third write data is stored into the rewritable non-volatile memory module via a first channel among the channels, wherein the read data is received from the rewritable non-volatile memory module via a second channel among the channels.

* * * * *